United States Patent
Xu

(10) Patent No.: US 11,031,260 B2
(45) Date of Patent: Jun. 8, 2021

(54) HYDROGEN FLUORIDE VAPOR PHASE CORROSION METHOD

(71) Applicant: JIANGSU LEUVEN INSTRUMENTS CO LTD, Jiangsu (CN)

(72) Inventor: Kaidong Xu, Jiangsu (CN)

(73) Assignee: JIANGSU LEUVEN INSTRUMENTS CO LTD, Jiangsu (CN)

( * ) Notice: Subject to any disclaimer, the term of this patent is extended or adjusted under 35 U.S.C. 154(b) by 0 days.

(21) Appl. No.: 16/454,233

(22) Filed: Jun. 27, 2019

(65) Prior Publication Data

US 2019/0318941 A1 Oct. 17, 2019

Related U.S. Application Data

(63) Continuation of application No. PCT/CN2017/099608, filed on Aug. 30, 2017.

(30) Foreign Application Priority Data

Dec. 29, 2016 (CN) .......................... 201611253281.7

(51) Int. Cl.
*H01L 21/00* (2006.01)
*H01L 21/67* (2006.01)
*H01L 21/02* (2006.01)

(52) U.S. Cl.
CPC .. *H01L 21/67028* (2013.01); *H01L 21/02049* (2013.01)

(58) Field of Classification Search
CPC ................ H01L 21/67028; H01L 21/02049
See application file for complete search history.

(56) References Cited

U.S. PATENT DOCUMENTS

| 2,431,715 A | * | 12/1947 | Wachter | ........................ 585/714 |
| 3,523,842 A | * | 8/1970 | Glendinning | ............. C23F 1/00 |
| | | | | 438/16 |
| 5,112,437 A | * | 5/1992 | Watanabe | ............... C03C 15/00 |
| | | | | 438/706 |

(Continued)

FOREIGN PATENT DOCUMENTS

| CN | 102881617 A1 | 1/2013 |
| CN | 103208443 A | 7/2013 |

(Continued)

OTHER PUBLICATIONS

Jennings, Herbert S., et al., "Corrosion by Hydrogen Fluoride and Hydrofluoric Acid". ASM Handbook, vol. 13C: Corrosion: Environments and Industries; S.D. Cramer, B.S. Covino, Jr., editors; pp. 690-703. DOI: 10.31399/asm.hb.v13c.a0004182.*

(Continued)

*Primary Examiner* — Bret P Chen
(74) *Attorney, Agent, or Firm* — Thomas E. Lees, LLC

(57) ABSTRACT

A hydrogen fluoride vapor phase corrosion method comprises: introducing a prescribed vaporized organic liquid into a reaction chamber after a vapor phase hydrogen fluoride containing water reacts, in the reaction chamber, with a wafer; the prescribed vaporized organic liquid, and the water remaining on a surface of the wafer form an azeotropic mixture; and evaporating or volatilizing the azeotropic mixture from the surface of the wafer to carry it out.

6 Claims, 5 Drawing Sheets

(56) References Cited

U.S. PATENT DOCUMENTS

| | | | | |
|---|---|---|---|---|
| 5,288,333 | A | * | 2/1994 | Tanaka .................. B08B 7/0092 134/11 |
| 6,511,613 | B1 | * | 1/2003 | Cizek ...................... C09K 8/54 252/396 |
| 2005/0191225 | A1 | * | 9/2005 | Hogle ..................... C25B 15/08 423/248 |
| 2009/0287027 | A1 | * | 11/2009 | Merkel ................... C07C 17/25 570/164 |
| 2011/0092665 | A1 | * | 4/2011 | Danner ................ C08G 65/226 528/402 |
| 2011/0306534 | A1 | * | 12/2011 | Hsu ...................... C11D 7/5004 510/176 |
| 2012/0134121 | A1 | * | 5/2012 | Kanemoto .......... B81C 1/00801 361/748 |
| 2015/0380268 | A1 | | 12/2015 | Toda et al. |
| 2017/0158506 | A1 | * | 6/2017 | Sasatani .................. C01B 7/191 |

FOREIGN PATENT DOCUMENTS

| | | | |
|---|---|---|---|
| CN | 105374714 A | | 3/2016 |
| CN | 105895503 A | | 8/2016 |
| JP | 10-22254 | * | 1/1998 ........... H01L 21/304 |
| KR | 100668182 B1 | | 1/2007 |

OTHER PUBLICATIONS

Simpson, Michael F., et al., "Quantitative measurement of beryllium-controlled redox of hydrogen fluoride in molten Flibe". Fusion Engineering and Design 81 (2006) 541-547.*

Blake, TA, et al., "Chemical Conversion of Anhydrous Hydrogen Fluoride for Safe Disposal". PNNL Report-27584 prepared for the US Department of Energy, Pacific Northwest National Laboratory, Jun. 2018, pp. 1-36.*

Tang, S.W., et al., "Corrosion behavior of a cerium-based conversion coating on alumina borate whisker-reinforced AA6061 composite pre-treated by hydrogen fluoride". Corrosion Science 53 (2011) 2636-2644.*

Zou, Guobo, et al., "Corrosion behavior of 904L austenitic stainless steel in hydrofluoric acid". RSC Adv., 2018, 8, 2811-2817.*

Wagner, Frederick T., et al., "Identification of surface hydronium: Coadsorption of hydrogen fluoride and water on platinum (111)". Surface Science, vol. 182, Issues 1-2, Mar. 3, 1987, pp. 125-149. Abstract Only.*

Translation of the Written Opinion of the International Searching Authority for PCT Application No. PCT/CN2017/099608; State Intellectual Property Office of the P.R. China; Beijing, China; dated Nov. 22, 2017.

International Search Report for PCT Application No. PCT/CN2017/099608; State Intellectual Property Office of P.R. China; Beijing, China; dated Nov. 22, 2017.

Written Opinion of the International Searching Authority for PCT Application No. PCT/CN2017/099608; State Intellectual Property Office of the P.R. China; Beijing, China; dated Nov. 22, 2017.

Chinese Rejection for Chinese Patent Application No. 201611253281.7, Chinese Patent Office; dated Nov. 9, 2020.

Chinese First Office Action for Chinese Patent Application No. 201611253281.7, Chinese Patent Office; dated Jan. 22, 2020.

Chinese Second Office Action for Chinese Patent Application No. 201611253281.7, Chinese Patent Office; dated Jan. 27, 2020.

* cited by examiner

HYDROGEN FLUORIDE VAPOR PHASE CORROSION METHOD

CROSS REFERENCE TO RELATED APPLICATIONS

This is a Continuation application of International Application Serial No. PCT/CN2017/099608, filed on Aug. 30, 2017, which claims the benefit of Chinese Application No. 201611253281.7, filed on Dec. 29, 2016, the disclosures of which are hereby incorporated by reference.

BACKGROUND

The disclosure relates to the technical field of micro-nano device processing technology, in particular to a hydrogen fluoride vapor phase corrosion apparatus and method.

In the field of micro-nano device processing technology, vapor phase corrosion, especially hydrogen fluoride vapor phase corrosion, is widely used in micro-nano device processing. Compared with liquid phase corrosion, vapor phase corrosion has many advantages: 1. Because it is a vapor phase corrosion, avoiding device failure such as stiction in liquid phase release micro-nano devices; 2. Because there is no surface tension effect, diffusion capacity of reactants is 4 orders of magnitude higher than that of liquid phase, so a chemical reaction is easy to carry out; 3. Compatibility with various materials such as aluminum, alumina, photoresist, etc.; 4. Because it is usually used under vacuum, it can be integrated as a surface pre-clean module on a modular cluster tool, such as a Physical Vapor Deposition (PVD) machine.

According to whether a hydrogen fluoride (HF) source contains water, vapor HF machines can be divided into: anhydrous HF machines and vapor phase (aqueous) HF machines. Wherein, the vapor phase HF machines are widely used due to its good cost performance. The vapor phase HF machines usually use an inert gas (such as nitrogen) as a carrier gas to be introduced into a hydrofluoric acid solution to bubble an HF—H$_2$O mixed steam, or directly atomize a pure hydrofluoric acid solution (about 49% by weight) and then help vaporization by heating or other means. However, when hydrofluoric acid is used as a hydrogen fluoride source for vapor phase corrosion, there is a risk of solid residue (SiO$_2$) on the surface of a wafer to be corroded, because a by-product of vapor phase corrosion, hexafluorosilicic acid (H$_2$SiF$_6$), can be adsorbed to the water on the surface of the wafer and finally left in the form of silicon dioxide (SiO$_2$) on the surface of the wafer to form a solid residue. The chemical reaction is as follows:

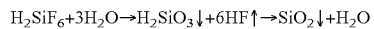

$$H_2SiF_6 + 3H_2O \rightarrow H_2SiO_3\downarrow + 6HF\uparrow \rightarrow SiO_2\downarrow + H_2O$$

How to reduce or avoid the deposition of solid residues is a problem to be solved in the art.

BRIEF SUMMARY

A main object of the present application is to provide a hydrogen fluoride vapor phase corrosion apparatus and method, which aims at solving the problem that the use of hydrofluoric acid as a vapor phase hydrogen fluoride source in the hydrogen fluoride vapor phase corrosion is prone to solid residue in the prior art.

In order to achieve the above object, the present disclosure provides a hydrogen fluoride vapor phase corrosion apparatus comprising a reaction chamber, a vapor phase hydrogen fluoride source, and a hydrogen fluoride vapor phase gain device, wherein the reaction chamber is provided with a first gas inlet and a second gas inlet, with the first gas inlet being connected to the vapor phase hydrogen fluoride source and the second gas inlet being connected to the hydrogen fluoride vapor phase gain device, and the hydrogen fluoride vapor phase gain device is configured to perform a gas-liquid mixing and vaporizing of a prescribed organic liquid and introduce it into the reaction chamber through the second gas inlet after a wafer placed in the reaction chamber reacts with a vapor phase hydrogen fluoride admitted from the first gas inlet, so that the prescribed vaporized organic liquid and a residual water on a surface of the wafer form an azeotropic mixture that evaporates or volatilizes more readily than water so as to be evaporated or volatilized easily from the surface of the wafer to be carried out.

In the hydrogen fluoride vapor phase corrosion apparatus of the present disclosure, preferably, the prescribed organic liquid includes a prescribed alcohol organic substance and/or a prescribed ketone organic substance.

In the hydrogen fluoride vapor phase corrosion apparatus of the present disclosure, preferably, the prescribed alcohol organic substance includes at least one of methanol, ethanol, and propanol, and the prescribed ketone organic substance includes acetone.

In the hydrogen fluoride vapor phase corrosion apparatus of the present disclosure, preferably, the reaction chamber is further provided with a third gas inlet, and the third gas inlet is connected to a nitrogen gas source for introducing nitrogen gas into the reaction chamber through the third gas inlet to purge residual hydrogen fluoride gas in the reaction chamber after a hydrogen fluoride corrosion reaction with the wafer and before the prescribed organic liquid is vaporized and introduced through the second gas inlet into the reaction chamber.

In another aspect, the present disclosure provides a hydrogen fluoride vapor phase corrosion method, comprising the steps of: introducing a prescribed vaporized organic liquid into a reaction chamber after a process of hydrogen fluoride vapor phase corrosion to a wafer; and evaporating or volatilizing an azeotropic mixture in an easy way from a surface of the wafer to carry it out after the prescribed vaporized organic liquid and the water on the surface of the wafer form the azeotropic mixture that is more likely to evaporate or volatilize than water.

In the hydrogen fluoride vapor phase corrosion method of the present disclosure, preferably, the prescribed organic liquid includes a prescribed alcohol organic substance and/or a prescribed ketone organic substance.

In the hydrogen fluoride vapor phase corrosion method of the present disclosure, preferably, a gas flow rate of a vapor of the prescribed vaporized organic liquid is 1 L/min~500 L/min.

In the hydrogen fluoride vapor phase corrosion method of the present disclosure, preferably, a time for introducing the vapor of the prescribed vaporized organic liquid is 1 min~100 min.

Preferably, the hydrogen fluoride vapor phase corrosion method of the present disclosure further comprises the step of: introducing nitrogen gas into the reaction chamber to purge residual hydrogen fluoride gas in the reaction chamber, after the process of vapor phase corrosion to the wafer by fluoride hydrogen and before the prescribed vaporized organic liquid is introduced into the reaction chamber.

In the hydrogen fluoride vapor phase corrosion method of the present disclosure, preferably, a flow rate of the nitrogen gas is 1 L/min~500 L/min, and a purge time thereof is 0.5 min~20 min.

With the hydrogen fluoride vapor phase corrosion apparatus and method provided by the disclosure, after the hydrogen fluoride reacts with the wafer, a vapor of a prescribed vaporized organic liquid can be introduced into the reaction chamber, so that the vapor of the prescribed organic liquid and the water in the reaction chamber, especially the water remaining on the surface of the wafer, form an azeotropic mixture and is carried away from the surface of the wafer and discharged from the reaction chamber. Since the prescribed vaporized organic liquid can form a completely mutually soluble homogeneous binary system of azeotropic mixture with the water in the reaction chamber, especially the water remaining on the surface of the wafer, the boiling point of the binary system is lower than that of water under the same conditions, which is more favorable for the volatilization and exhaustion of moisture; in the absence of water, the HF vapor phase corrosion does not easily form $SiO_2$ precipitate, thereby effectively suppressing solid residue.

DETAILED DESCRIPTION

It should be noted that the specific embodiments described herein are merely illustrative of the invention and are not intended to limit the invention.

Figure 1:
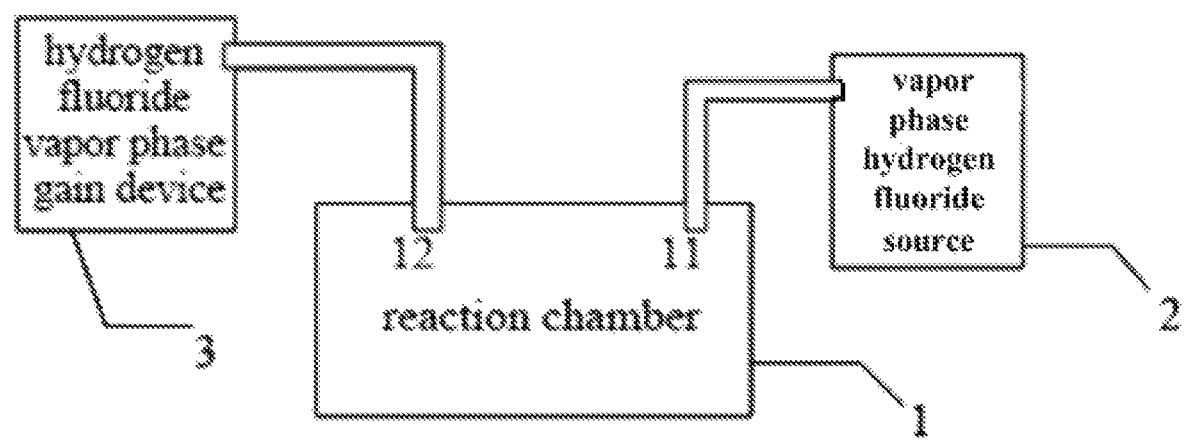
FIG. 1 is a schematic structural view of a hydrogen fluoride vapor phase corrosion apparatus according to an embodiment of the present disclosure.

As shown in FIG. 1, an embodiment of the present disclosure provides a hydrogen fluoride vapor phase corrosion apparatus comprising: a reaction chamber 1, a vapor phase hydrogen fluoride source 2, and a hydrogen fluoride vapor phase gain device 3. The reaction chamber 1 is provided with a first gas inlet 11 and a second gas inlet 12. The first gas inlet 11 is connected to the vapor phase hydrogen fluoride source 2, and the second gas inlet 12 is connected to the hydrogen fluoride vapor phase gain device 3. The hydrogen fluoride vapor phase gain device 3 is configured to perform a gas-liquid mixing and vaporizing of a prescribed organic liquid, and introduce it through the second gas inlet 12 into the reaction chamber 1, after a wafer placed in the reaction chamber 1 reacts with the vapor phase hydrogen fluoride entering from the first gas inlet port 11, so that the prescribed vaporized organic liquid and the water in the reaction chamber 1, especially the water remaining on a surface of the wafer, form an azeotropic mixture which is more likely to evaporate or volatilize than water so as to be evaporated or volatilized from the surface of the wafer in the reaction chamber and carried out.

With the hydrogen fluoride vapor phase corrosion apparatus of the embodiment, after the hydrogen fluoride reacts with the wafer, the prescribed organic liquid can be introduced into the reaction chamber 1 after gas-liquid mixing and vaporizing, so that the prescribed vaporized organic liquid and the water in the reaction chamber 1, especially the water remaining on the surface of the wafer, form an azeotropic mixture to be discharged from the reaction chamber 1. Since the prescribed organic liquid can form a completely mutually soluble homogeneous binary system of azeotropic mixture with the water in the reaction chamber, especially the water remaining on the surface of the wafer, and the boiling point of the binary system is lower than that of water under the same conditions, which is more favorable for the volatilization and exhaustion of moisture; in the absence of water, the HF vapor phase corrosion does not easily form $SiO_2$ precipitate, thereby effectively suppressing solid residue.

Specifically, the prescribed organic liquid may be any organic substance capable of forming an azeotropic mixture with water, and a boiling point of the azeotropic mixture is lower than a boiling point of water under the same conditions. For example, the prescribed organic liquid may include a prescribed alcoholic organic substance and/or a prescribed ketone organic substance.

Optionally, the prescribed alcohol organic substance may include one or more of the following: methanol, ethanol, propanol (isopropyl alcohol), and the prescribed ketone organic substance may include acetone or the like. Table 1 lists boiling points for several prescribed organic liquid at several atmospheric pressures.

TABLE 1

| | | Boiling point (° C.) | | | | | |
|---|---|---|---|---|---|---|---|
| Formula | Name | 1 Pa | 10 Pa | 100 Pa | 1 kPa | 10 kPa | 100 kPa |
| $C_3H_8O$ | propanol | −65e | −49e | −28e | −1.3 | 33.6 | 82.0 |
| $CH_4O$ | methanol | −87e | −69e | −47.5 | −20.4 | 15.2 | 64.2 |
| $C_2H_6O$ | alcohol | −73e | −56e | −34e | −7e | 29.2 | 78 |
| $H_2O$ | water | −60.7s | −42.2s | −20.3s | 7.0 | 45.8 | 99.6 |
| $C_3H_6O$ | acetone | −95 | −81.8 | −62.8 | −35.6 | 1.3 | 55.7 |
| $C_3H_8O$ | isopropanol | −54e | −38e | −16e | 10e | 47e | 96.9 |

In Table 1, e is an abbreviation for evaporation, indicating that the liquid begins to evaporate; s is an abbreviation for solid, indicating that the liquid is still solid.

Figure 2:
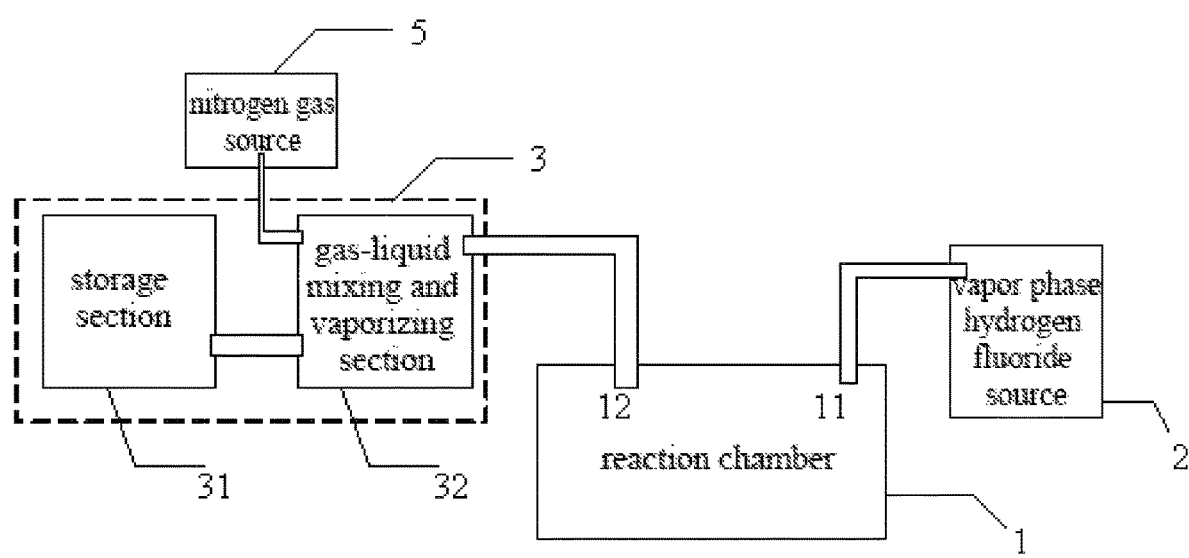
FIG. 2 is another schematic structural diagram of a hydrogen fluoride vapor phase corrosion apparatus according to an embodiment of the present disclosure.

As shown in FIG. 2, in order to further improve vaporization effect of the organic liquid, in one embodiment of the present disclosure, the hydrogen fluoride vapor phase gain device 3 includes a storage section 31 and a gas-liquid mixing and vaporizing section 32. The storage section 31 is used to store the prescribed organic liquid. The gas-liquid mixing and vaporizing section 32 has a first end connected to the storage section 31, a second end connected to the nitrogen gas source 5, and a third end connected to the second gas inlet 12 of the reaction chamber 1 and is configured to mix and vaporize the prescribed organic liquid output from the storage section 31 and the nitrogen gas supplied from the nitrogen gas source 5 together and input them to the reaction chamber 1. Optionally, a liquid flow meter may be provided between the storage section 31 and the gas-liquid mixing and vaporizing section 32 to monitor the amount of the prescribed organic liquid input into the gas-liquid mixing and vaporizing unit 32. Optionally, in order to control the proportion of nitrogen gas in the mixed gas, a nitrogen gas flow meter may be provided between the nitrogen gas source 5 and the gas-liquid mixing and vaporizing section 32.

In the above embodiment, the gas flow rate of the prescribed vaporized organic liquid may be adjusted according to specific needs. Optionally, the gas flow rate of the prescribed vaporized organic liquid may be between 1 L/min and 500 L/min.

Further, the time for introducing the prescribed organic liquid may also be selected according to technical requirements. For example, optionally, the time for introducing the vapor of the prescribed organic liquid may be between 1 minute and 100 minutes.

Figure 3:
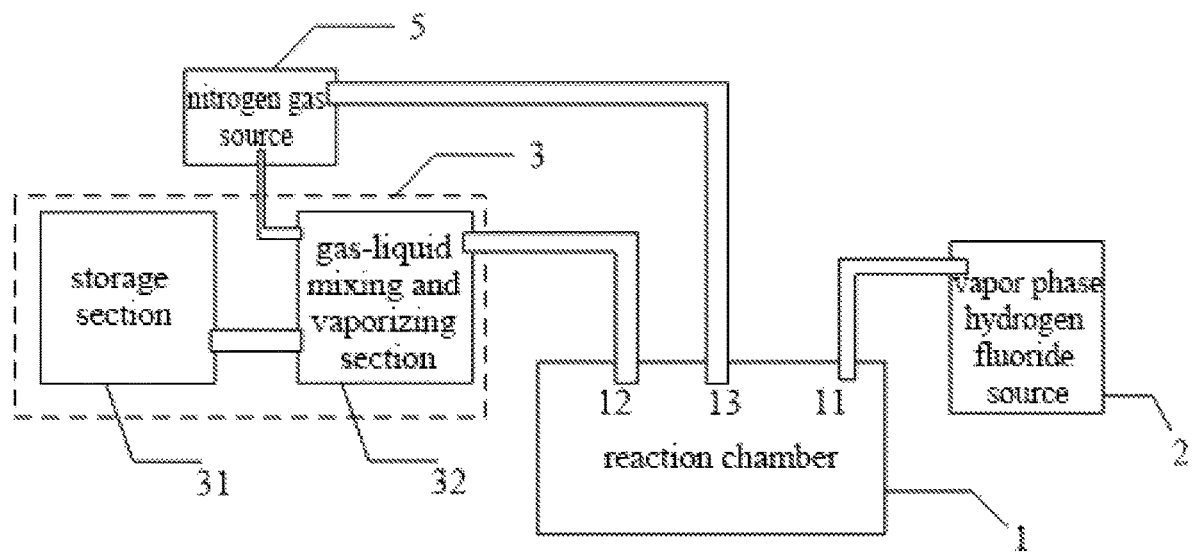
FIG. 3 is further another schematic structural diagram of a hydrogen fluoride vapor phase corrosion apparatus according to an embodiment of the present disclosure.

As shown in FIG. 3, in one embodiment of the present disclosure, the reaction chamber 1 is further provided with a third gas inlet 13. The third gas inlet 13 is connected to the nitrogen gas source 5. The nitrogen gas source 5 can be used to introduce nitrogen gas into the reaction chamber 1 through the third gas inlet 13 to allow the nitrogen gas to purge residual hydrogen fluoride in the reaction chamber 1 so as to further reduce the formation of silica solid residue, after the process of hydrogen fluoride vapor phase corrosion to the wafer and before the prescribed organic liquid is vaporized and introduced into the reaction chamber 1 through the second gas inlet 12.

In the above embodiment, the nitrogen gas flow rate can be adjusted according to specific needs. Optionally, the nitrogen gas flow rate can be between 1 L/min and 500 L/min.

Further, the purging time of nitrogen gas can also be selected according to technical requirements. For example, the purging time can be between 0.5 minutes and 20 minutes.

Figure 4:
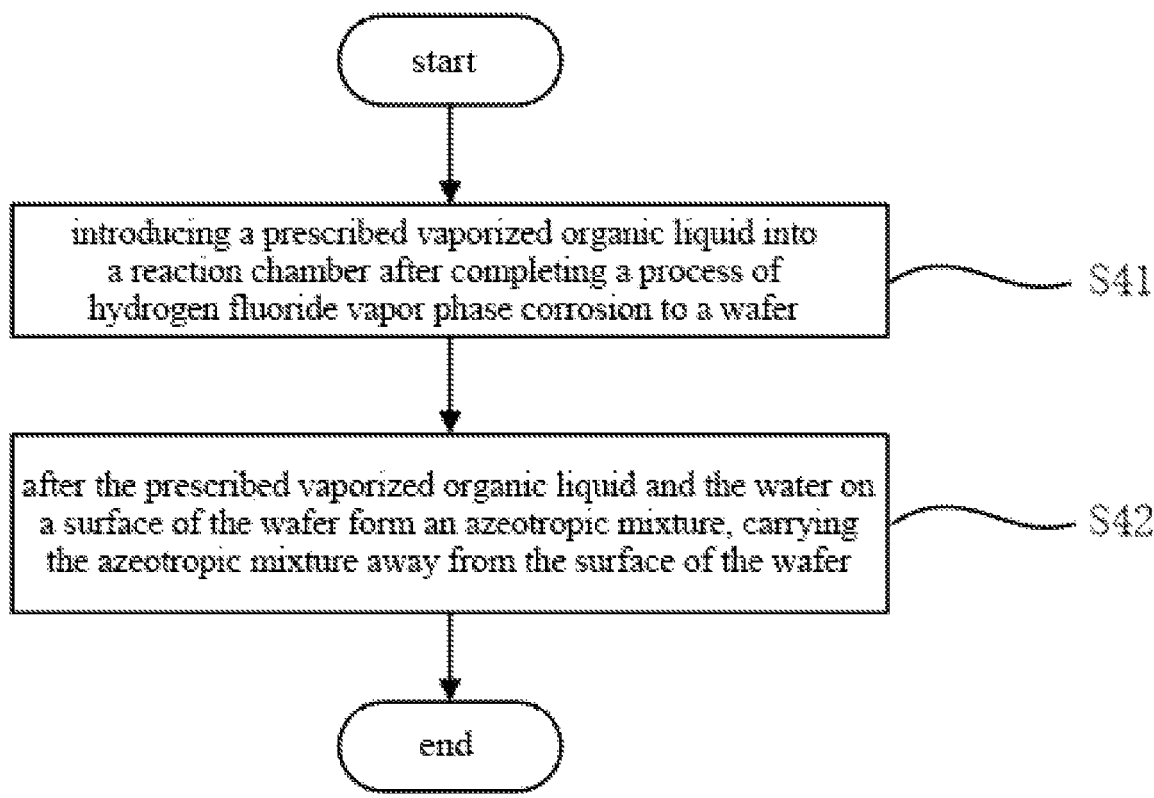
FIG. 4 is a flow chart of a hydrogen fluoride vapor phase corrosion method according to an embodiment of the present disclosure.

Correspondingly, as shown in FIG. 4, the present disclosure further provides a hydrogen fluoride vapor phase corrosion method, comprising the following steps: S41, introducing a prescribed vaporized organic liquid into a reaction chamber after completing a process of hydrogen fluoride vapor phase corrosion to a wafer; S42, after the prescribed vaporized organic liquid and the water in the reaction chamber, especially the water remaining on a surface of the wafer, form an azeotropic mixture, carrying the azeotropic mixture away from the surface of the wafer in the reaction chamber.

With the hydrogen fluoride vapor phase corrosion method of the embodiment, after the hydrogen fluoride reacts with the wafer, a prescribed organic liquid can be vaporized and introduced into the reaction chamber, so that the prescribed organic liquid and the water in the reaction chamber, especially the water remaining on the surface of the wafer, form an azeotropic mixture, which vaporizes and volatilizes more easily than water, so as to be more easily discharged from the reaction chamber by vaporization and volatilization. Since the prescribed organic liquid can form a completely mutually soluble homogeneous binary system of azeotropic mixture with the water in the reaction chamber, the boiling point of the binary system is lower than that of water under the same conditions, which is more favorable for the volatilization and exhaustion of moisture; in the absence of water, the HF vapor phase corrosion does not easily form $SiO_2$ precipitate, thereby effectively suppressing solid residue.

Specifically, the prescribed organic liquid may be any organic substance capable of forming an azeotropic mixture with water and a boiling point of the azeotropic mixture is lower than a boiling point of water under the same conditions. For example, the prescribed organic liquid may include a prescribed alcoholic organic substance and/or a prescribed ketone organic substance.

Optionally, the prescribed alcohol organic substance may include one or more of the following: methanol, ethanol, propanol (isopropyl alcohol), and the prescribed ketone organic substance may include acetone or the like.

Further, the hydrogen fluoride vapor phase corrosion method of the embodiments of the present disclosure may further comprises the step of: introducing nitrogen gas to the surface of the wafer in the reaction chamber to make the nitrogen gas purge residual hydrogen fluoride in the reaction chamber, especially on the surface of the wafer, after the process of vapor phase corrosion to the wafer by fluoride hydrogen and before the prescribed vaporized organic liquid is introduced into the reaction chamber.

The hydrogen fluoride vapor phase corrosion method of the embodiments of the present disclosure will be described in detail below by way of specific examples.

Figure 5:
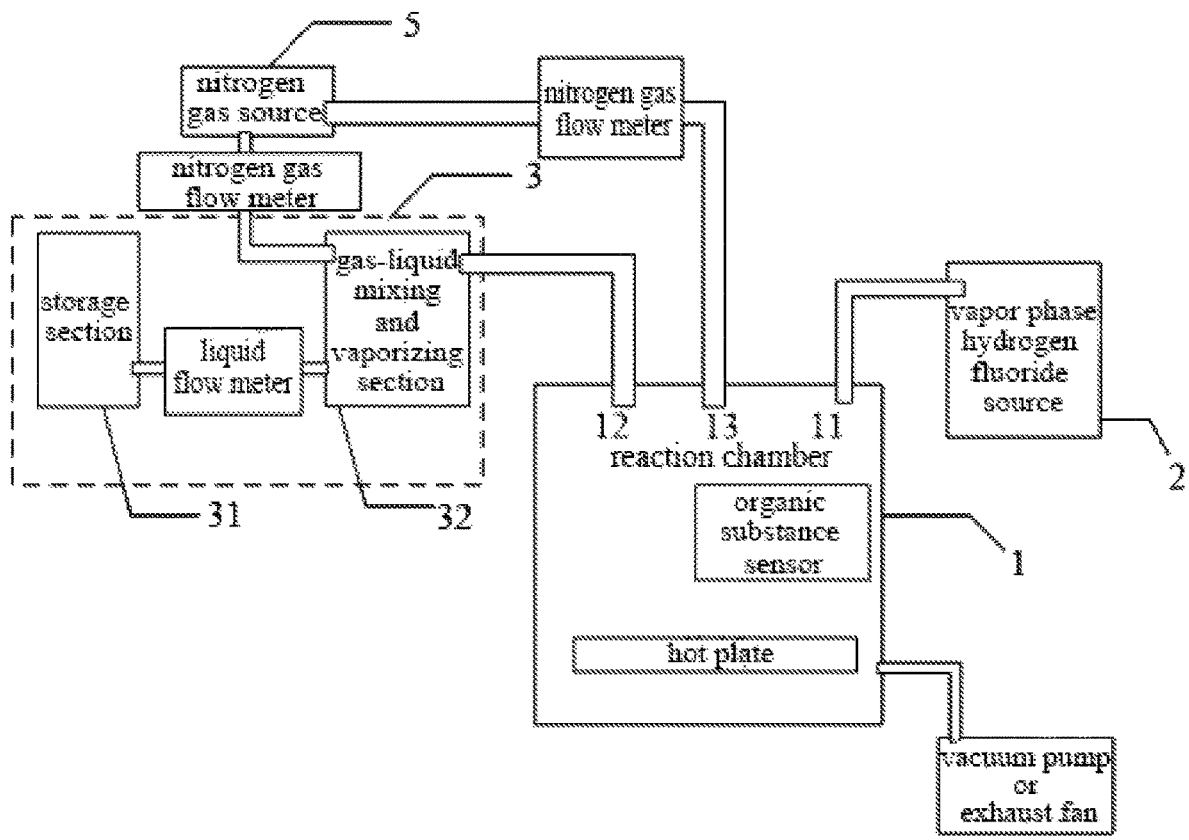
FIG. 5 is a schematic structural diagram showing more details of an apparatus for the hydrogen fluoride vapor phase corrosion method according to an embodiment of the present disclosure.

FIG. 5 is a schematic structural diagram showing more details of an apparatus for the hydrogen fluoride vapor phase corrosion method of the embodiments of the present disclosure. Based on the apparatus shown in FIG. 5, after the HF corrosion process is completed, a high-purity nitrogen gas can be introduced into the HF corrosion chamber to purge the residual HF vapor quickly. The flow rate of the nitrogen gas is 1 L/min~500 L/min, and the purge is performed for about 0.5 minutes~20 minutes. Thereafter, an alcohol or organic vapor liquid-gas, after mixing and vaporization, is introduced to form an azeotropic mixture with the water on the surface of the wafer to the full. A gas flow rate for the vaporized organic vapor is 1 L/min~500 L/min, and a process time is 1 min~100 min.

During and after the reaction, a vacuum pump (all exhaust gas pipes need to be heated to 20 to 100° C.) or an exhaust fan may be used for tail gas treatment. For the tail gas treatment by an exhaust fan, a large amount of corrosive gas such as HF may be first extracted by an acid-alkali exhaust fan, and then an organic exhaust fan is used to extract organic vapor. After introduction of the organic vapor, a high-purity nitrogen gas is introduced into the reaction chamber at a flow rate of 1 L/min to 500 L/min for 5 to 500 minutes. When an organic substance sensor in the corrosion reaction chamber does not detect the organic substance of a set concentration, a hot plate is heated to 100-300° C. to desorb the organic substance residue adsorbed on the surface of the wafer, and the heating time is 0.1 min-20 min. For the sake of safety, the concentration of the organic substance in the reaction chamber is set according to international standards such as time-weighted average concentration (TWA value) and threshold limit value (TLV value), which is controlled below a concentration to avoid injury to human body, and its content is reduced below a minimum percentage to avoid spontaneous combustion and self-explosion by controlling exhaust time. After that, a lift-off pin is lifted up and the hot plate is cooled. When there is no pressure difference between the chamber and the outside, the chamber is opened and the wafer is taken out to complete all processes.

The above are only preferred embodiments of the present disclosure, and are not intended to limit the scope of the invention. All equivalent structures or equivalent process modifications made based on the description and the drawings of the present disclosure, or any applications to other related technical fields directly or indirectly, will fall within the scope of patent protection of the present invention.

Disclosed are a hydrogen fluoride vapor phase corrosion apparatus and method in the field of micro-nano device processing technology, aiming at solving the problem that the use of hydrofluoric acid as a vapor phase hydrogen fluoride source in the hydrogen fluoride vapor phase corrosion is prone to solid residue in the prior art. The apparatus comprises a reaction chamber (1), a vapor phase hydrogen fluoride source (2), and a hydrogen fluoride vapor phase gain device (3). The reaction chamber (1) is provided with a first gas inlet (11) and a second gas inlet (12), with the first gas inlet (11) being connected to the vapor phase hydrogen fluoride source (2) and the second gas inlet (12) being connected to the hydrogen fluoride vapor phase gain device (3). The hydrogen fluoride vapor phase gain device (3) is configured to perform a gas-liquid mixing and vaporizing of a prescribed organic liquid and introduce it into the reaction chamber (1) through the second gas inlet (12) after a wafer placed in the reaction chamber (1) reacts with a vapor phase hydrogen fluoride admitted from the first gas inlet (11), so that the prescribed vaporized organic liquid and residual water in the reaction chamber (1), especially the water on a surface of the wafer, form an azeotropic mixture that evaporates or volatilizes more readily than water so as to be evaporated or volatilized easily from the surface of the wafer to be carried out.

What is claimed is:

1. A hydrogen fluoride vapor phase corrosion method, the method comprising:
    introducing a prescribed vaporized organic liquid into a reaction chamber after a vapor phase hydrogen fluoride containing water reacts, in the reaction chamber, with a wafer;
    the prescribed vaporized organic liquid, and the water remaining on a surface of the wafer form an azeotropic mixture; and
    evaporating or volatilizing the azeotropic mixture from the surface of the wafer to carry it out.

2. The hydrogen fluoride vapor phase corrosion method of claim 1, wherein the prescribed vaporized organic liquid includes a prescribed alcohol organic substance and/or a prescribed ketone organic substance.

3. The hydrogen fluoride vapor phase corrosion method of claim 1, wherein a gas flow rate of a vapor of the prescribed vaporized organic liquid is 1 L/min~500 L/min.

4. The hydrogen fluoride vapor phase corrosion method of claim 1, wherein a time for introducing a vapor of the prescribed vaporized organic liquid is 1 min~100 min.

5. The hydrogen fluoride vapor phase corrosion method of claim 1, further comprising the step of:
    introducing nitrogen gas into the reaction chamber to purge residual hydrogen fluoride gas in the reaction chamber, after the vapor phase fluoride hydrogen containing water reacts, in the reaction chamber, with the wafer and before the prescribed vaporized organic liquid is introduced into the reaction chamber.

6. The hydrogen fluoride vapor phase corrosion method of claim 5, wherein a flow rate of the nitrogen gas is 1 L/min~500 L/min, and a purge time thereof is 0.5 min~20 min.

* * * * *